US008801440B2

(12) United States Patent
Ma

(10) Patent No.: US 8,801,440 B2
(45) Date of Patent: Aug. 12, 2014

(54) ELECTRICAL CONNECTOR WITH LOW PROFILE

(71) Applicant: Hon Hai Precision Industry Co., Ltd., New Taipei (TW)

(72) Inventor: Hao-Yun Ma, Santa Clara, CA (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 47 days.

(21) Appl. No.: 13/647,347

(22) Filed: Oct. 8, 2012

(65) Prior Publication Data

US 2014/0099831 A1   Apr. 10, 2014

(51) Int. Cl.
*H01R 12/00* (2006.01)

(52) U.S. Cl.
USPC ............................................. 439/71; 439/266

(58) Field of Classification Search
USPC ...................... 439/71, 73, 266, 268
See application file for complete search history.

(56) References Cited

U.S. PATENT DOCUMENTS

| 5,419,710 | A |   | 5/1995  | Pfaff |
|-----------|---|---|---------|-------|
| 5,456,613 | A |   | 10/1995 | McHugh |
| 5,738,531 | A | * | 4/1998  | Beaman et al. ................. 439/71 |
| 5,919,050 | A | * | 7/1999  | Kehley et al. ................... 439/71 |
| 7,001,197 | B2|   | 2/2006  | Shirai et al. |
| 7,950,932 | B2|   | 5/2011  | Fan |
| 2008/0081940 | A1| * | 4/2008 | Byun ............................... 600/9 |
| 2009/0325402 | A1| * | 12/2009 | Hsu et al. ....................... 439/71 |

* cited by examiner

*Primary Examiner* — Gary Paumen
(74) *Attorney, Agent, or Firm* — Wei Te Chung; Ming Chieh Chang

(57) ABSTRACT

An electrical connector includes a contact carrier receiving a plurality of contacts with solder balls, respectively. A socket frame has an opening formed by a number of sidewalls, the contact carrier is disposed in the opening and lower than the sidewalls. A bottom support has a thin board located below and supported the contact carrier and the socket frame, and an aperture is formed by the thin board to allow the solder balls passing through thereof. The thin board of the bottom support at least attaches with the socket frame.

20 Claims, 7 Drawing Sheets

ELECTRICAL CONNECTOR WITH LOW PROFILE

BACKGROUND OF THE INVENTION

1. Field of the Invention

The present invention relates to a electrical connector, and more particularly to the electrical connector having low-profile housing so as to reduce the profile of the socket connector.

2. Description of Related Art

Various types of conventional electrical connectors for use with electronic packages are well known to the skilled in the art. The electronic packages are classified as ball grid array packages, pin grid array packages, and land grid array packages in view of the interface of the electronic packages, i.e. pin legs or conductive pads of the electronic packages. The electrical connector for attaching ball grid array package can refer to U.S. Pat. No. 5,419,710; the electrical connector for attaching pin grid array package can be referred to U.S. Pat. No. 5,456,613; and the electrical connector for attaching land grid array package can be referred to U.S. Pat. No. 7,001,197.

U.S. Pat. No. 7,001,197 issued to Shirai et al. on Feb. 26, 2006 discloses an electrical connector having an insulative housing having a top surface for receiving a land grid array package. The insulative housing is made with plastic material and includes a contact carrier having a plurality of contacts and four sidewalls integrally extending upwardly from the contact carrier to restrain the package. A cover member is pivotally mounted on a first end of the insulative housing. The cover member is pivotal between an open position and a closed position where the cover member presses the land grid array package toward the top surface of the insulative housing so that the land grid array package electrically connects to the contacts. A lever is pivotally mounted on a second end of the insulative housing. The lever has a locking portion for locking the cover member in the closed position. A metallic reinforcing plate is positioned on a bottom surface of the housing. The metallic reinforcing plate extends between the first end and the second end of the insulative housing.

However, the electrical connector said above is not meet the trend of low profile and miniaturization. Furthermore, U.S. Pat. No. 7,950,932 issued to Fan et al. on May 31, 2011 discloses a low profile electrical connector with a contact carrier with a plurality of contacts and a frame surrounding the contact carrier. The contact carrier is made with PCB (printed circuit board) material with a low profile. But Fan fails to disclose how to link the contact carrier and the frame. If the frame can move with regard to the contact carrier, the package will not have a fine connection with the contacts.

Therefore, an improved electrical connector is needed.

SUMMARY OF THE INVENTION

An object of the present invention is to provide a low profile electrical connector.

According to one aspect of the present invention, an electrical connector comprises a contact carrier assembling a plurality of contacts with solder balls, respectively. A socket frame has an opening formed by a plurality of sidewalls, the contact carrier is disposed in the opening and lower than the sidewalls. A bottom support has a thin board located below and supported the contact carrier and the socket frame, and an aperture is formed by the thin board to allow the solder balls passing through thereof. The thin board of the bottom support at least attaches with the socket frame.

According to another aspect of the present invention, an electrical connector for use with an electronic package, comprises a contact carrier assembling a plurality of contacts with solder balls. A socket frame is surrounding the contact carrier for receiving the electronic package. A bottom support is attached with a bottom of the socket frame to prevent the socket frame from moving upwardly and downwardly in a vertical direction, and supporting the contact carrier to prevent the contact carrier from moving downwardly in the vertical direction.

Other objects, advantages and novel features of the invention will become more apparent from the following detailed description of a preferred embodiment when taken in conjunction with the accompanying drawings.

DETAILED DESCRIPTION OF THE INVENTION

Figure 1:
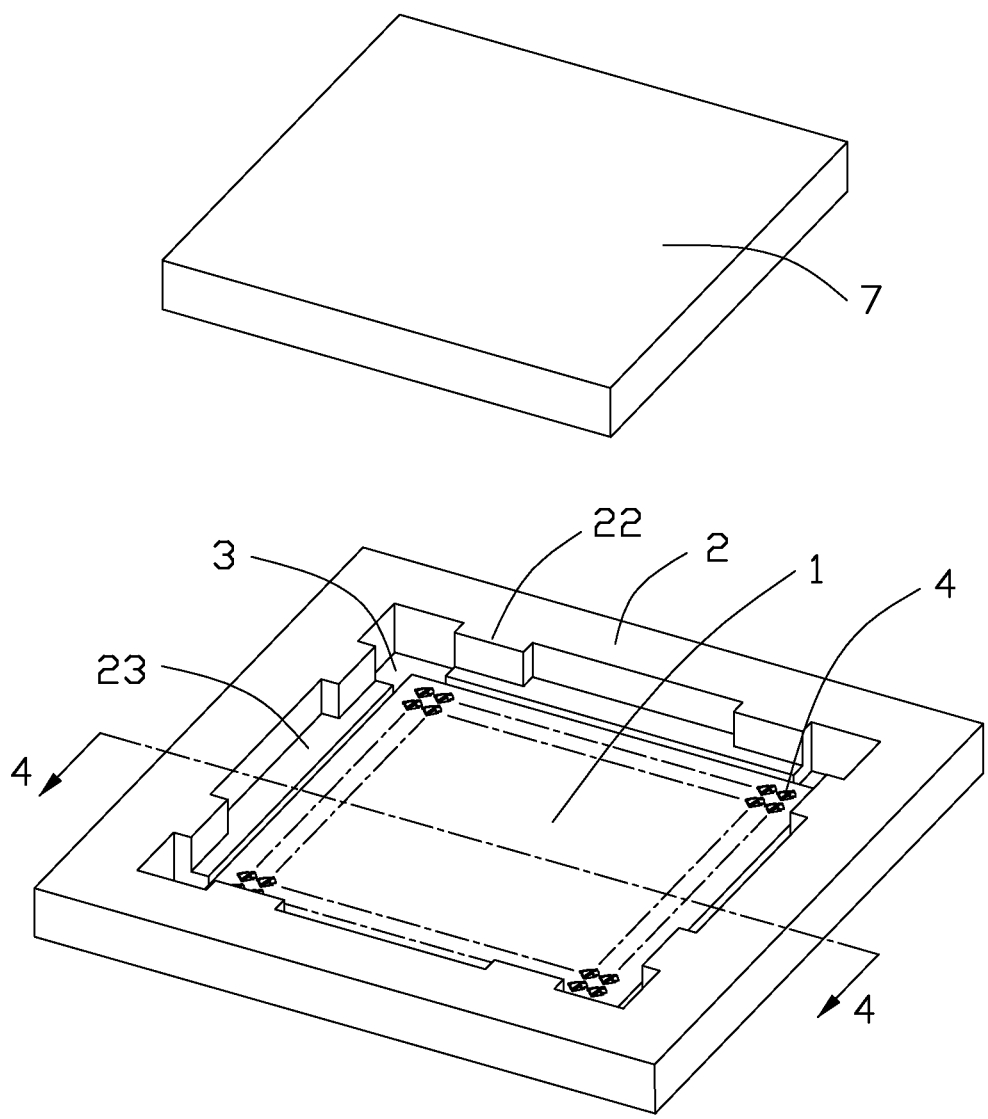
FIG. 1 is an assembled, perspective view of an electrical connector with an electronic package in accordance with the present invention.
Figure 2:
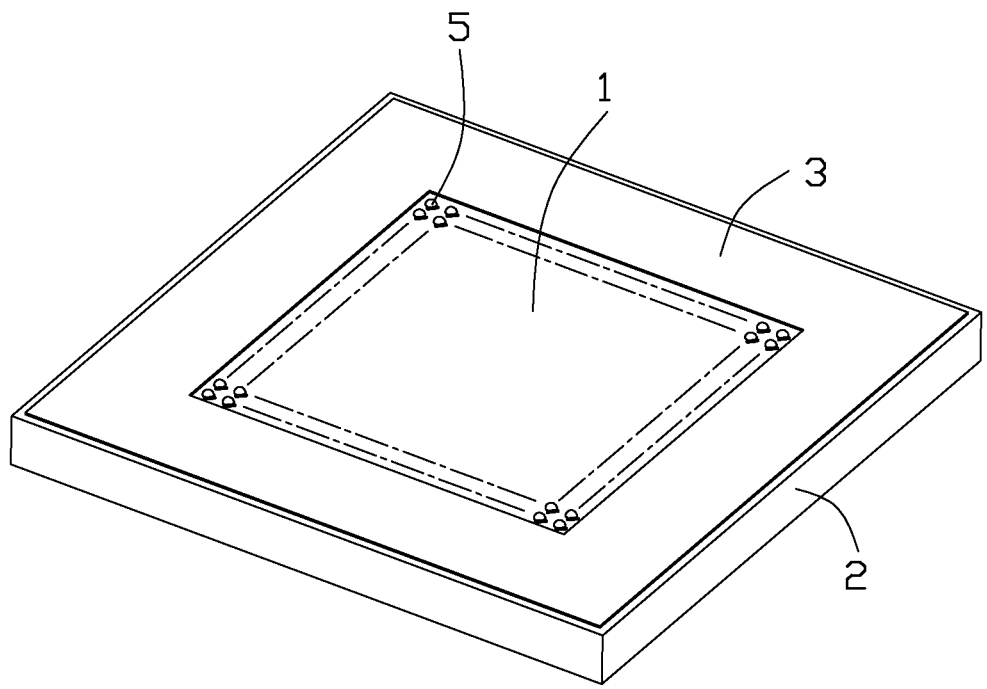
FIG. 2 is a bottom, perspective view of the electrical connector shown in FIG. 1.
Figure 3:
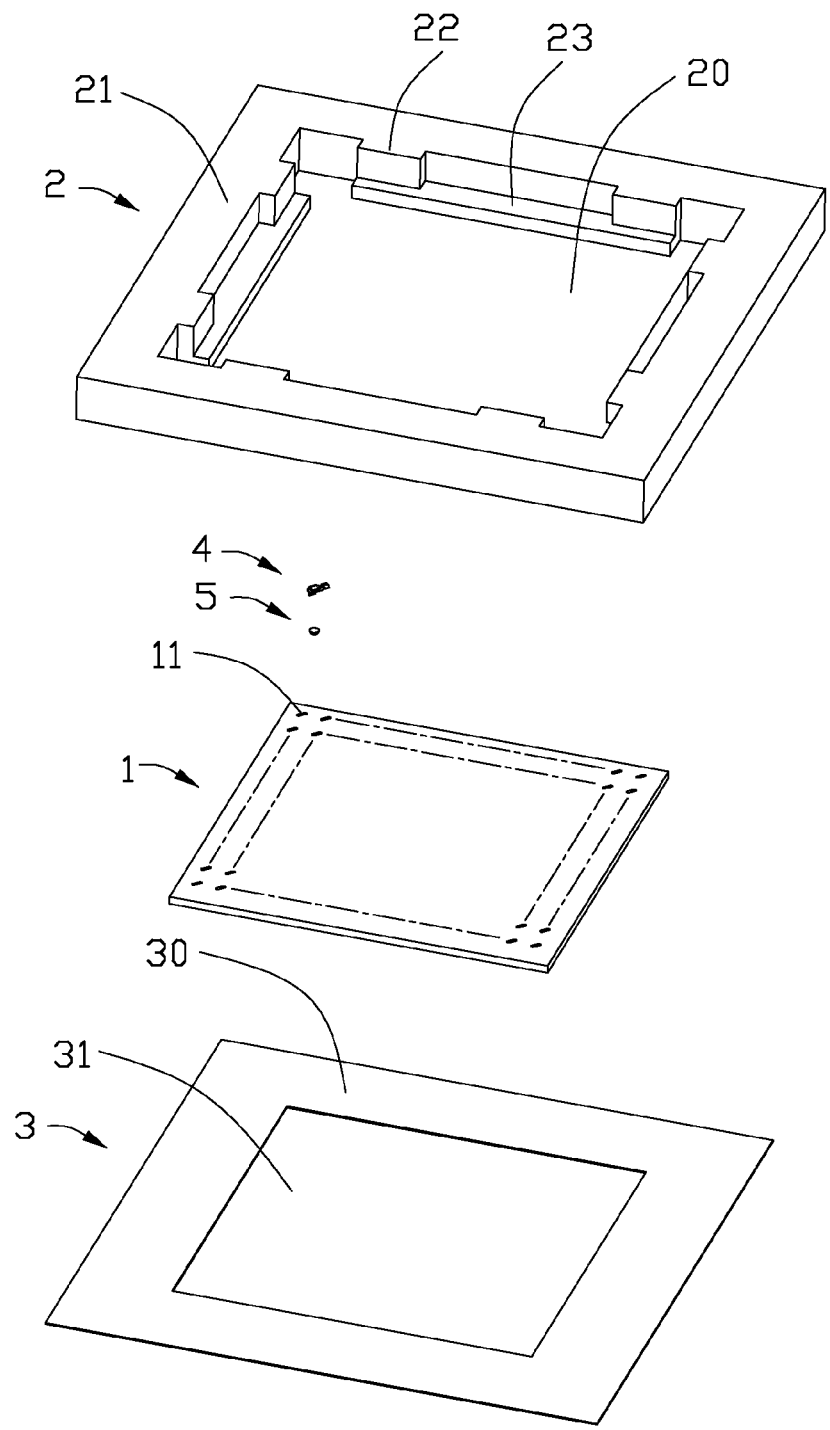
FIG. 3 is an exposed view of the electrical connector.

Referring to FIGS. 1 to 3, an electrical connector used for electrically connecting an electronic package 7 and a printed circuit board (PCB, not shown), comprises a contact carrier 1 with a plurality of contacts 4 and solder balls 5, a socket frame 2 surrounding the contact carrier 1, and a bottom support 3 located below the contact carrier 1 and the socket frame 2 to link thereof.

The contact carrier 1 is made with PCB material and configured substantially rectangular shape. A plurality of through holes 11 are defined on the contact carrier 1 and the contacts 4 are disposed in the through holes 11, respectively.

The socket frame 2 has four sidewalls 21 and formed an opening 20 thereof. The sidewalls 21 are higher than the contact carrier 1. Each sidewall 21 integrated defines two datums 22 extending toward the opening 20 to give a datum to the electronic package 7 abutting there against. Each sidewall 21 also integrated defines a seating plane 23 located below the datums 22 and extending more inward than the datums 22 for supporting the electronic package 7.

The bottom support 3 is configured with an aperture 31 by a thin board 30 and can be made with vary materials. The aperture 31 is a through hole to allow the solder balls 5 to pass through therein. The bottom support 3 located below the contact carrier 1 and socket frame 2 may be flush with both the contact carrier 1 and socket frame 2 on the same side. The bottom support 3 also can serve as a soldering stand-off except to link the contact carrier 1 and the socket frame 2.

Figure 4:
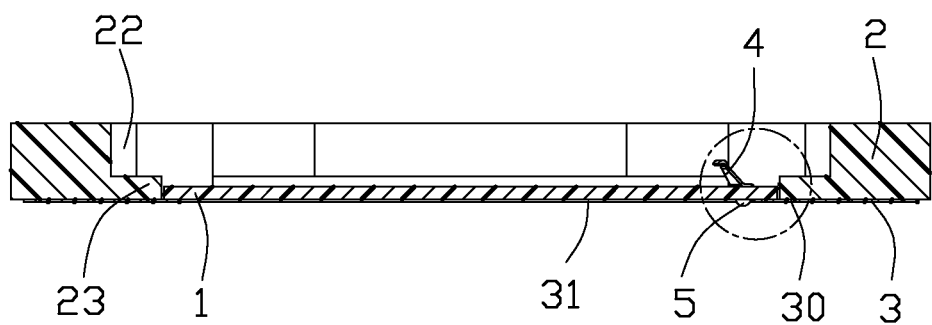
FIG. 4 is a cross-sectional view taken along line 4-4 of FIG. 1.
Figure 5:
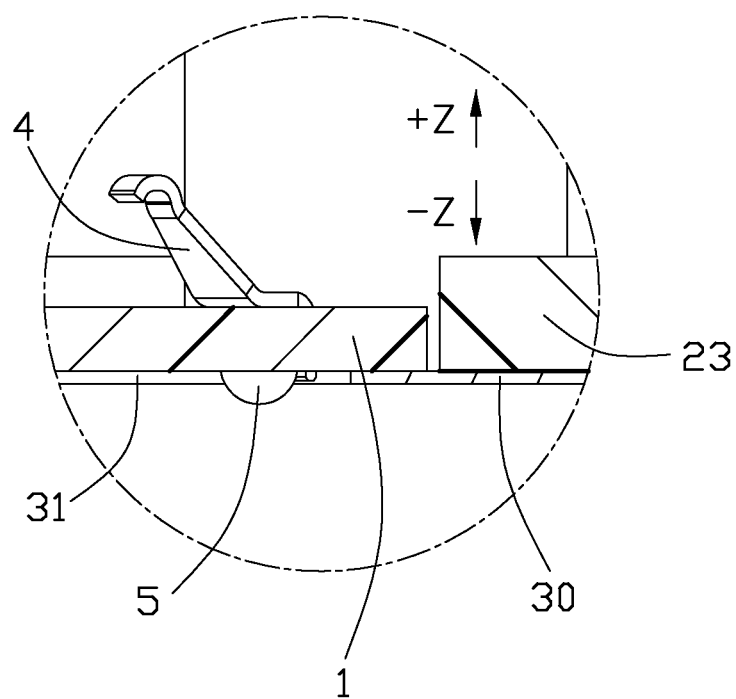
FIG. 5 is an enlarged view of circle showed in FIG. 4.

FIGS. 4-5 shows a number of cross-sectional views of the assembled electrical connector. The contact carrier 1 and the socket frame 2 are both positioned upon the thin board 30 and the socket frame 2 is located in the opening 20 of the socket frame 2. The solder balls 5 are all disposed in the aperture 31 of the bottom support 3. The seating plane 23 of the socket frame 2 is surrounding the contact carrier 1 and has a height higher than the contact carrier 1 for supporting the electronic package 7 to prevent the contacts 4 from over pressing and lower than the top of the contacts 4 to allow the electronic package 7 to connect with the contacts 4.

Figure 6:
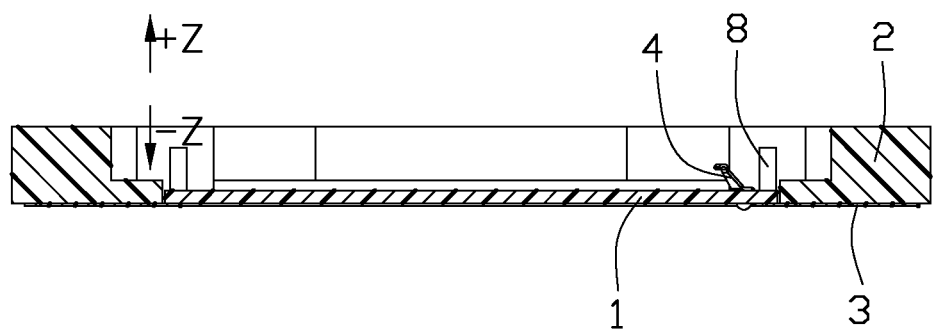
FIG. 6 is similar to FIG. 4, but shown a second embodiment of the electrical connector in accordance with the present invention.
Figure 7:
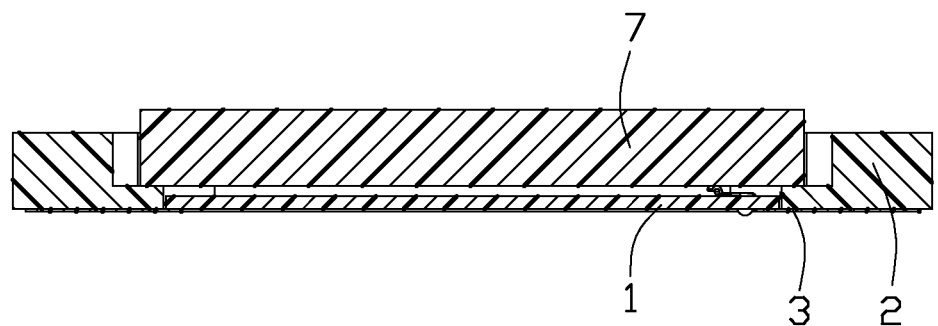
FIG. 7 is similar to FIG. 4, but the electronic package is assembled to the electrical connector.

The instant invention at least comprises two embodiments. The first embodiment is that the thin board 30 of the bottom support 3 not only supports the socket frame 2 and the contact carrier 1 but also attaches with the socket frame 2 and the contact carrier 1. Thus, the bottom support 3 can hold the contact carrier 1 in +Z direction and −Z direction in vertically. The second embodiment is that the thin board 30 of bottom support 3 supports the socket frame 2 and the contact carrier 1 but only attaches with the socket frame 2, thereby the bottom support 3 can just hold the contact carrier 1 only in −Z direction. In this case, another component 8 is need to hold the contact carrier 1 in +Z direction as shown in FIG. 6. The another component 8 may be a pick-up cap. In the instant invention, the thin board 30 of the bottom support 3 attaching with the socket frame 2 and the contact carrier 1 may be have many methods, such as adhibition and locking by latch.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector comprising:
   a contact carrier assembling a plurality of contacts with solder balls, respectively;
   a socket frame having an opening formed by a plurality of sidewalls, the contact carrier being disposed in the opening and lower than the sidewalls;
   a bottom support having a thin board for supporting the contact carrier and the socket frame, an aperture formed on the thin board to allow the solder balls to pass therethrough; and wherein
   the thin board of the bottom support at least attaches with the socket frame.

2. The electrical connector as claimed in claim 1, wherein the thin board of the bottom support further attaches with the contact carrier.

3. The electrical connector as claimed in claim 1, wherein the thin board of the bottom support attaches with the socket frame by adhesive or locking via latch.

4. The electrical connector as claimed in claim 1, wherein the contact carrier is seating on the bottom support and another component is abutted against top surface of the contact carrier.

5. The electrical connector as claimed in claim 1, wherein the sidewalls integrated define at least two datums extending toward the opening.

6. The electrical connector as claimed in claim 5, wherein the sidewalls also integrated define a seating plane located below the datums and extending more inwardly than the datums.

7. The electrical connector as claimed in claim 6, wherein the seating plane is higher than the contact carrier and lower than the top of the contacts.

8. The electrical connector as claimed in claim 1, wherein the bottom support may be flush with both the contact carrier and the socket frame on the same side.

9. An electrical connector for use with an electronic package, comprising:
   a contact carrier assembling a plurality of contacts with solder balls, respectively;
   a socket frame surrounding the contact carrier for receiving the electronic package;
   a bottom support attached with a bottom of the socket frame to prevent the socket frame from moving upwardly and downwardly in a vertical direction, and supporting the contact carrier to prevent the contact carrier from moving downwardly in the vertical direction.

10. The electrical connector as claimed in claim 9, wherein the bottom support includes a thin board forming with an aperture.

11. The electrical connector as claimed in claim 10, wherein a bottom surface and a top surface of the contact carrier is hold by the thin board of the bottom support and another component, respectively.

12. The electrical connector as claimed in claim 10, wherein the thin board of the bottom support attaches with the socket frame and further attaches with the contact carrier in the vertical direction.

13. The electrical connector as claimed in claim 9, wherein the socket frame defines four sidewalls with a seating plane interconnecting with the four sidewalls and formed an opening for receiving and supporting the electronic package.

14. The electrical connector as claimed in claim 13, wherein the seating plane is higher than the contact carrier and lower than the top of the contacts.

15. An electric connector for use with an electronic package, comprising:
   an insulative contact carrier carrying a plurality of contacts therewith;
   a plurality of solder balls attached to bottom ends of the corresponding contacts, respectively;
   a socket frame surrounding said contact carrier circumferentially;
   a bottom support linked to a bottom side of the socket frame in an associative co-moving manner and further upwardly supporting a bottom side of the contact carrier while exposing said solder balls downwardly.

16. The electrical connector as claimed in claim 15, wherein said socket frame defines an opening for receiving said contact carrier with a plurality inward seating planes extending into the opening to commonly define a seating plane for upwardly supporting the electronic package, and a plurality of datum planes for sidewardly confronting the electronic package.

17. The electrical connector as claimed in claim 16, wherein an upper face of the contact carrier is lower than said seating plane.

18. The electrical connector as claimed in claim 17, wherein said inward seating planes commonly defines a first space, in a top view, for receiving said contact carrier, and said datum planes commonly defines a second space, in the top view, for receiving said electronic package, said first space being smaller than said second space in the top view.

19. The electrical connector as claimed in claim 15, wherein said bottom support is linked to the bottom side of the contact carrier in the associative co-moving manner.

20. The electrical connector as claimed in claim 15, wherein 15, wherein said bottom support defines a frame structure similar to the socket frame in a top view.

* * * * *